United States Patent
Crain, Jr. et al.

(10) Patent No.: US 9,087,805 B2
(45) Date of Patent: Jul. 21, 2015

(54) SEMICONDUCTOR TEST AND MONITORING STRUCTURE TO DETECT BOUNDARIES OF SAFE EFFECTIVE MODULUS

(71) Applicant: International Business Machines Corporation, Armonk, NY (US)

(72) Inventors: James V. Crain, Jr., Milton, VT (US); Mark C. H. Lamorey, South Burlington, VT (US); Christopher D. Muzzy, Burlington, VT (US); Thomas M. Shaw, Peekskill, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/524,637

(22) Filed: Oct. 27, 2014

(65) Prior Publication Data
US 2015/0044787 A1 Feb. 12, 2015

Related U.S. Application Data

(62) Division of application No. 13/448,775, filed on Apr. 17, 2012.

(51) Int. Cl.
*H01L 21/66* (2006.01)
*G01R 31/26* (2014.01)
*H01L 23/522* (2006.01)
*H01L 23/00* (2006.01)

(52) U.S. Cl.
CPC ............ *H01L 22/34* (2013.01); *G01R 31/2601* (2013.01); *G01R 31/2607* (2013.01); *H01L 24/14* (2013.01); *H01L 23/522* (2013.01); *H01L 24/13* (2013.01); *H01L 2224/13111* (2013.01); *H01L 2224/14131* (2013.01); *H01L 2224/14515* (2013.01); *H01L 2924/14* (2013.01)

(58) Field of Classification Search
CPC ................................. H01L 22/34; H01L 24/14
USPC .......................................... 257/48; 438/14–18
See application file for complete search history.

(56) References Cited

U.S. PATENT DOCUMENTS 5,315,485 A 5/1994 Magill et al.
5,936,260 A 8/1999 Corbett et al.
(Continued)

OTHER PUBLICATIONS

Bradley, Notice of Allowance and Fee(s) Due for U.S. Appl. No. 13/448,775 dated Dec. 5, 2014, 7 pages.
(Continued)

*Primary Examiner* — Cheung Lee
*Assistant Examiner* — Stephen Bradley
(74) *Attorney, Agent, or Firm* — David Cain; Hoffman Warnick LLC

(57) ABSTRACT

A method of testing an integrated circuit (IC) chip and a related test structure are disclosed. A test structure includes a monitor chain proximate to at least one solder bump pad, the monitor chain including at least one metal via stack, each metal via stack extending from a lower metal layer in the IC chip to an upper metal layer in the IC chip, such that the monitor chain forms a continuous circuit proximate to the at least one solder bump pad, and where each metal via stack is positioned substantially under the solder bump. A method for testing to detect boundaries of safe effective modulus includes performing a stress test on an IC chip containing the test structure joined to a semiconductor package.

19 Claims, 5 Drawing Sheets

(56) References Cited

U.S. PATENT DOCUMENTS

| | | |
|---|---|---|
| 6,218,726 B1 | 4/2001 | Chang et al. |
| 6,548,881 B1 | 4/2003 | Blish et al. |
| 7,102,377 B1 | 9/2006 | Blanchet et al. |
| 7,196,428 B2 | 3/2007 | Chen |
| 7,312,529 B2 | 12/2007 | Clevenger et al. |
| 7,675,147 B1 | 3/2010 | Hubbard et al. |
| 7,719,302 B2 | 5/2010 | Hsu et al. |
| 7,939,824 B2 | 5/2011 | Peng et al. |
| 8,159,254 B2 | 4/2012 | Kaltalioglu |
| 8,217,394 B2 | 7/2012 | Yang et al. |
| 8,618,827 B2 * | 12/2013 | Shao et al. ............... 324/762.05 |
| 2005/0224966 A1 | 10/2005 | Fogel et al. |
| 2006/0292711 A1 | 12/2006 | Su et al. |
| 2008/0191205 A1 | 8/2008 | Tsai et al. |
| 2009/0236724 A1 | 9/2009 | Zhang |
| 2009/0243645 A1 * | 10/2009 | Shinkawata .................. 324/765 |
| 2012/0032327 A1 * | 2/2012 | Lee et al. ...................... 257/738 |
| 2012/0261662 A1 * | 10/2012 | Liang et al. ..................... 257/48 |

OTHER PUBLICATIONS

Bansal et al., "Reliability of High-end Flip-Chip Package with Large 45nm Ultra Low-k Die", IEEE, 2008 Electronic Components and Technology Conference, pp. 1357-1361.

Pang et al., "Lead-Free 95.5Sn-3.8Ag-0.7Cu Solder Joint Reliability Analysis for Micro-BGA Assembly", IEEE, 2004 Inter Society Conference on Thermal Phenomena, pp. 131-136.

Bradley, Office Action Communication for U.S. Appl. No. 13/448,775 dated Jun. 5, 2014, 11 pages.

Bradley, Office Action Communication for U.S. Appl. No. 13/448,775 dated Feb. 3, 2014, 8 pages.

Bradley, Office Action Communication for U.S. Appl. No. 13/448,775 dated Aug. 8, 2013, 13 pages.

* cited by examiner the various drawings that depict various embodiments

SEMICONDUCTOR TEST AND MONITORING STRUCTURE TO DETECT BOUNDARIES OF SAFE EFFECTIVE MODULUS

FIELD OF THE INVENTION

The subject matter disclosed herein relates to methods and structures for testing semiconductor chips. More specifically, aspects of the invention relate to test and monitoring structures to detect boundaries of safe effective modulus.

BACKGROUND

In flip chip processing of semiconductor integrated circuit (IC) chips, C4 solder bumps are used to connect IC dies to packaging. However, due to the coefficient of thermal expansion (CTE) mismatch between different layers in the packaging, C4 solder bumps experience large stresses which can lead to crack formation during chip joining. Testing has shown that a dielectric under the C4 bumps is more likely to crack during chip joining (referred to as "white bump formation") when the effective modulus of the dielectric layers under the C4 bumps is lower. The effective modulus of the back end of line (BEOL) stack depends on the modulus of the dielectric layers in the stack and the amount and arrangement of the metallization in the stack. As the modulus of the metal features is typically much higher than that of the dielectric, the effective modulus of the stack can be increased by increasing the metal density.

BRIEF SUMMARY

A method of testing an integrated circuit (IC) chip and a related test structure are disclosed. A test structure includes a monitor chain proximate to at least one solder bump pad, the monitor chain including at least one metal via stack, the metal via stack extending from a lower metal layer in the chip to an upper metal layer in the chip, such that the monitor chain forms a continuous circuit proximate to the at least one solder bump pad, and where each metal via stack is positioned substantially under the solder bump. A method for testing to detect boundaries of safe effective modulus includes performing a stress test on an IC chip containing the test structure. A stress test is run on the IC chip to obtain information relating to the circuit formed by the monitor chain, e.g., whether the circuit was broken, or resistance through the circuit changed, during the stress test. In one embodiment, a plurality of monitor chains can be used and different metal densities or patterns can be used near each monitor chain. Information obtained regarding the circuits can be compared to determine an optimal metal density, e.g., how low a metal density can be used before cracking.

A first embodiment of the invention includes an integrated circuit (IC) chip test structure comprising: an IC chip having a plurality of layers, at least two of the plurality of layers being metal layers; at least one solder bump pad on the IC chip; a solder bump positioned on the at least one solder bump pad; and a monitor chain proximate to the at least one solder bump pad, wherein the monitor chain comprises at least one metal via stack, the at least one metal via stack extending from a lower metal layer in the IC chip to an upper metal layer in the IC chip, such that the monitor chain forms a continuous circuit proximate to the at least one solder bump pad, and where the at least one metal via stack is positioned substantially under the solder bump.

A second embodiment of the invention includes a method of testing an integrated circuit (IC) chip, the method comprising: providing an IC chip having a plurality of layers, at least two of the plurality of layers being metal layers, wherein the IC chip includes a test structure comprising: at least one solder bump pad on the IC chip; a solder bump positioned on the at least one solder bump pad; and a monitor chain proximate to the at least one solder bump pad, wherein the monitor chain comprises at least one metal via stack, the at least one metal via stack extending from a lower metal layer in the IC chip to an upper metal layer in the IC chip, such that the monitor chain forms a continuous circuit proximate to the at least one solder bump pad, and where the at least one metal via stack is positioned substantially under the solder bump; joining the IC chip to a semiconductor package; performing at least one stress test on the semiconductor package; and obtaining information related to the circuit.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
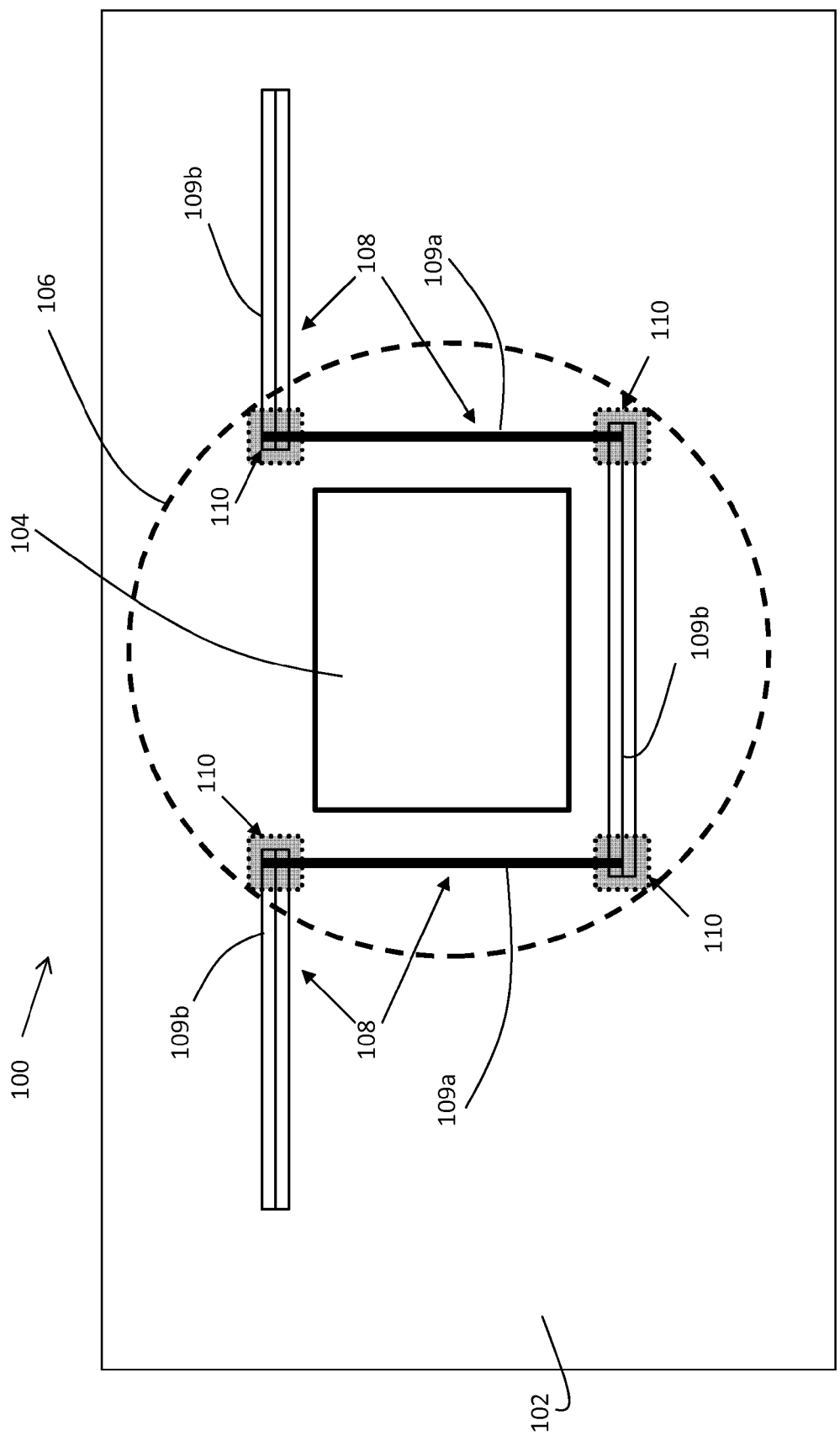
FIG. 1 shows a top down view of an integrated circuit (IC) chip and test structure according to an embodiment of this invention.

Turning to FIG. 1, an integrated circuit (IC) chip 102 including a test structure 100 according to an embodiment of the invention is shown. FIG. 1 is a top down view of IC chip 102 including test structure 100. As known in the art, IC chip 102 has a plurality of layers, at least two of those layers being metal layers 109a, 109b. It is also understood that at least one layer in IC chip 102 can be an ultra low-K layer 103 (shown in FIG. 4), and at least one metal layer 109a, 109b can be positioned below ultra low-K layer 103 (directly or not directly) and at least one metal layer 109a, 109b can be positioned above ultra low-K layer 103 (directly or not directly).

As shown in FIG. 1, IC chip 102 includes at least one solder bump pad 104. As shown in phantom lines in FIG. 1, solder bump pad 104 is configured for a solder bump 106 to be positioned thereon. Solder bump 106 may be any solderable material that can include, but is not limited to, material having tin and lead, tin without lead, tin with a residual of copper or silver, tin bismuth, tin indium, etc.

Figure 2:
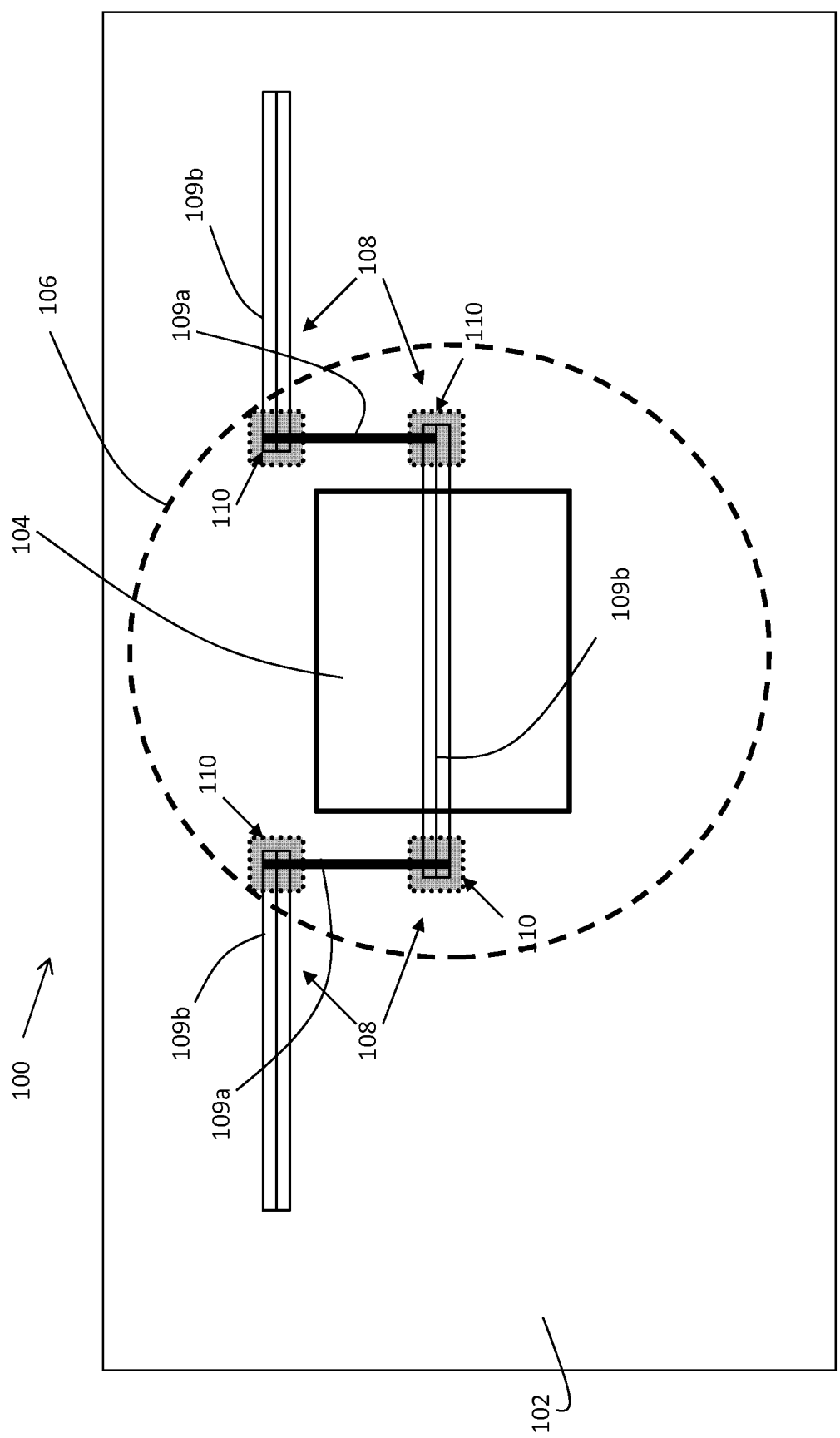
FIG. 2 shows a top down view of an integrated circuit (IC) chip and test structure according to another embodiment of this invention.
Figure 3:
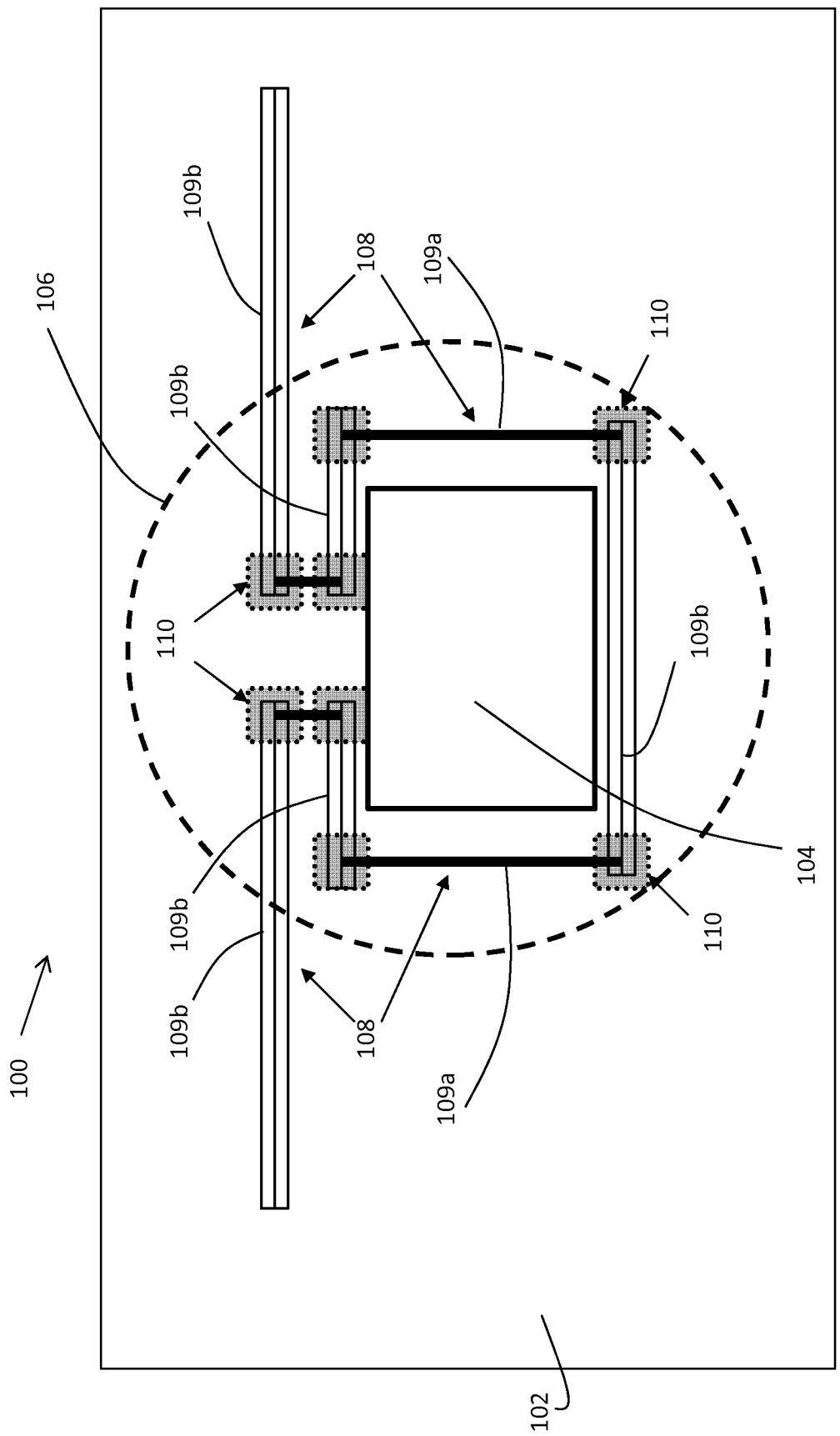
FIG. 3 shows a top down view of an integrated circuit (IC) chip and test structure according to another embodiment of this invention.

As shown in FIG. 1, test structure 100 further includes a monitor chain 108 proximate, or at least partially around, the at least one solder bump pad 104. As shown in FIGS. 1-3 in top-down views, monitor chain 108 includes at least one metal via stack 110 extending between two or more metal layers, e.g., layers 109a, 109b. In the top-down view of FIGS. 1-3, metal via stacks 110 are shown in cross-hatching to indicate that each stack 110 extends into IC chip 102. As shown in cross-section in FIG. 4, a metal via stack 110 can include any number of metal layers, e.g., M2 thru MN−1, extending between metal layers 109a, 109b. Each metal via stack 110 extends from a lower metal layer 109a in IC chip 102 to an upper metal layer 109b in IC chip 102. Any number of metal via stacks 110 can be used, for example, four metal via stacks 110 as shown in FIGS. 1-3, with each metal via stack 110 extending from a first metal layer 109a to a second metal layer 109b, with any number of metal layers, e.g., M2 thru MN−1, in between. The number of metal layers can vary depending on how many are needed for the back end of line (BEOL) processing. Each metal via stack 110 can comprise any standard via metal used, for example, copper with a lining such as tantalum nitride.

Therefore, in the configuration shown in FIG. 1, monitor chain 108 forms a continuous circuit proximate to, or at least partially around, at least one solder bump pad 104, and, as shown in FIG. 1, each metal via stack 110 is positioned substantially under solder bump 106.

Alternate configurations of monitor chain 108 are shown in FIGS. 2 and 3. For example, in FIG. 2, monitor chain 108 is at least partially underneath solder bump pad 104, while in FIG. 3, monitor chain 108 includes additional metal via stacks 110 while forming a continuous circuit at least partially around solder bump pad 104.

It is understood that while one solder bump pad 104 is shown in the figures, an array of solder bump pads can be surrounded by monitor chain 108. For example, an n×n or n×m array of solder bump pads can be used, where n and m are any integers, in one example, at least a 9×9 array.

Figure 4:
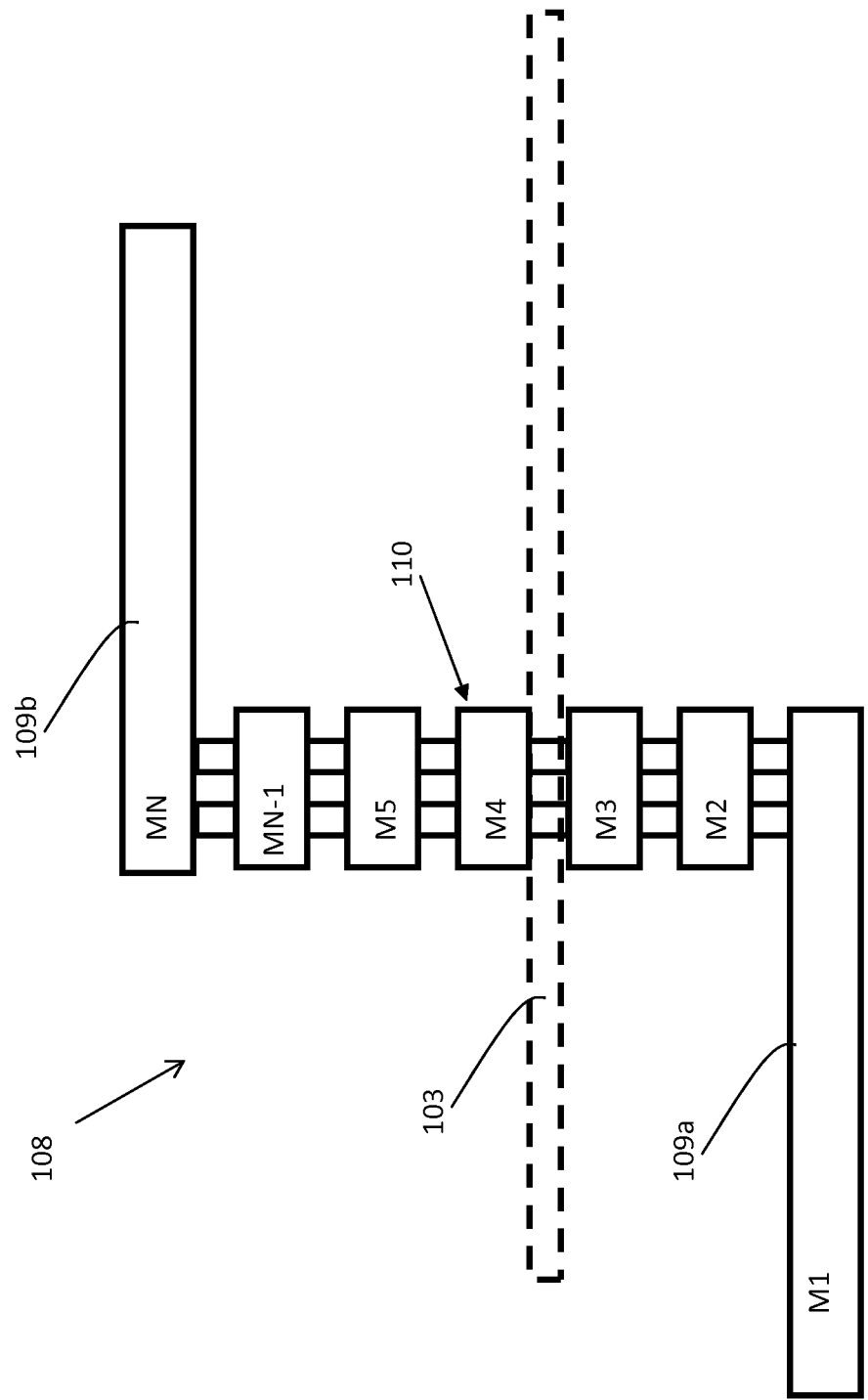
FIG. 4 shows a cross-sectional view of a monitor chain according to an embodiment of the invention.

In one embodiment, each metal via stack 110 extends from a lower metal layer 109a, at least below ultra low-K layer 103, but preferably multiple layers below ultra low-K layer 103, to an upper metal layer 109b at least above ultra low-K layer 103, but preferably to a top, metal, layer 109b of IC chip 102. It is understood that while ultra low-K layer 103 is shown in FIG. 4 near a third and fourth metal layer of metal via stack 110, ultra low-K layer 103 can be positioned anywhere in IC chip 102 as desired.

In one embodiment, monitor chain 108 can be positioned proximate to, or at least partially surrounding, a solder bump pad 104 (or array of pads) near the corner of IC chip 102. This is typically because the areas near the corners of IC chip 102 are the high-stress areas of IC chip 102 that are usually desired to be tested or monitored, e.g., by use of the methods disclosed herein.

Figure 5:
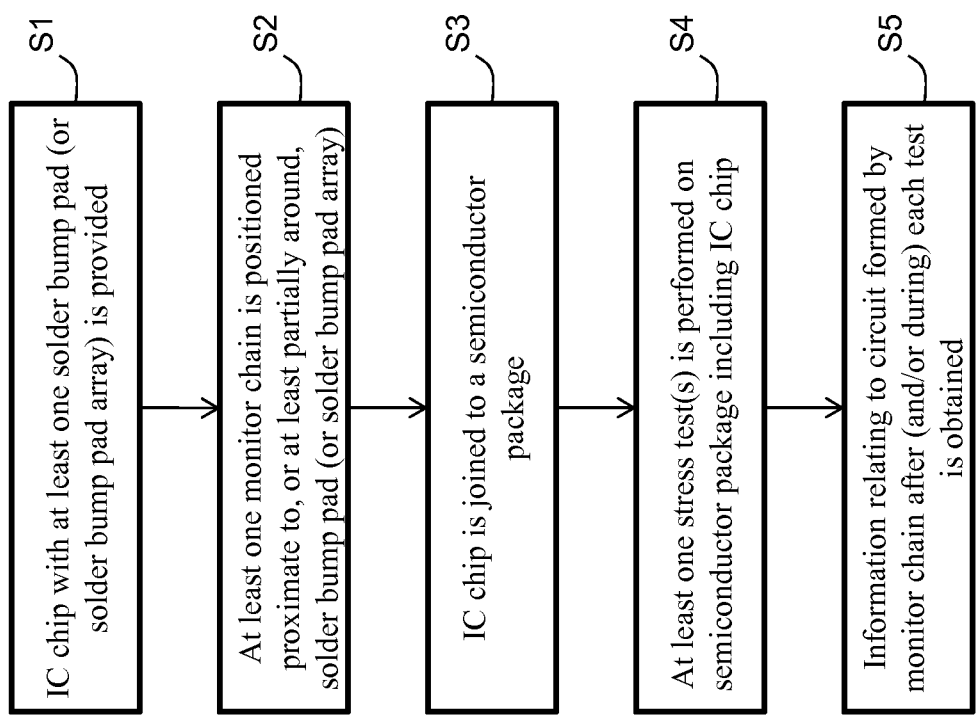
FIG. 5 shows a flow diagram illustrating a method according to various embodiments of the invention.

A method using test structure 100 to detect boundaries of safe effective modulus is shown in FIG. 5. In step S1, an IC chip 102 having at least one solder bump pad 104 (or array of pads) is provided. In step S2, a monitor chain 108 is positioned proximate to, or at least partially around, the at least one solder bump pad 104 (or array of pads), such that a continuous circuit is formed around the pad(s) 104. Next, in step S3, IC chip 102 is joined to a semiconductor package, as known in the art. Then, in step S4, at least one stress test is performed on the semiconductor package including IC chip 102. Any known or later developed stress test can be used that attempts to replicate the coefficient of thermal expansion (CTE) stresses that occur when chips or wafers are fused together, for example, a hammer test, which includes a chip join solder reflow profile with an exceptionally fast cool down to maximize the stress passed through the C4 solder bump. Any other type of stress test could be used, including, but not limited to, a thermocycle test, a drop or vibration test, or a thermal shock test.

In step S5, information relating to the circuit formed by monitor chain 108 is obtained. This information can be obtained during and/or after the stress test(s). The information can comprise anything relevant to the circuit, for example, when the circuit is broken, and/or when a change in resistance in the circuit occurs. Any change in the circuit could indicate a structural issue with IC chip 102, for example, a crack or warping. Therefore, electrical information regarding the circuit can be used to determine at what metal density or pattern an IC chip is compromised, i.e., the circuit is affected.

In one embodiment, a plurality of monitor chains 108 are provided on IC chip 102, each monitor chain 108 surrounding a solder bump pad 104 (or arrays of pads) in a different area of IC chip 102. In one example, each different area could have a different metal density and/or metal pattern. Information obtained from each circuit formed by each monitor chain 108 can be compared to determine an optimal metal density, e.g., how low a metal density can be used before cracking or affecting the circuit, and/or a modulus of the BEOL stack (e.g., combined flexibility/malleability of the metal/dielectric combination). This determination can be done by compiling data relating to each metal density and/or metal pattern area on a chip, compiling data obtained from each circuit near those areas, noting when a change in a circuit occurs, and therefore noting when a crack or disruption has occurred in those areas. It can then be extrapolated which metal density and/or metal pattern is preferable, i.e., which density/pattern results in the least amount of cracking.

In another embodiment, a plurality of IC chips 102 are provided, each having a test structure 100 and a different metal density near its monitor chain 108, and each IC chip 102 joined to a semiconductor package. A stress test can be performed on each semiconductor package containing an IC chip 102, and again, information relating to each circuit from each monitor chain 108 could be compared to determine boundaries of a safe effective modulus.

It is understood that any type of bump configuration can be tested and compared in accordance with embodiments of this invention. For example, a dense bump area next to a sparse bump area, or a dense design data area next to a dense fill area. Testing performed according to embodiments of this invention may also contain combinatorial logic of bump/area organizations. Key boolean attributes being density and metal feature, e.g., design (e.g., fat wire vs. thin wire) and fill, and therefore a near infinite set of combinations are possible, but can be bounded by the effective modulus of the design area.

The methods and structures disclosed herein provide a way to test IC chip limits with respect to metal loading, and hence an acceptable modulus of the BEOL structures under C4 solder bumps. Test structure 100 provides a testable structure in high stress regions of pad/pad structures with a measurable metal density and pattern. Using test structure 100 and the methods discussed herein, an allowable lower limit of metal density can be determined, and therefore, it can be determined what density structure is required to survive testing. Altering a line width and including or excluding vias can alter the metal density/modulus of a region of the IC chip, and then when tested, it can be determined whether that metal density/modulus was acceptable, or too low. For example, if a circuit is disrupted or broken during testing of a certain region, it can be determined that the metal density/modulus in that region was too low.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of testing an integrated circuit (IC) chip, the method comprising:
    providing an IC chip having a plurality of layers, at least two of the plurality of layers being metal layers, wherein the IC chip includes a test structure comprising:
        at least one solder bump pad on the IC chip;
        a solder bump positioned on the at least one solder bump pad; and
        a plurality of monitor chains within the IC chip, wherein each of the plurality of monitor chains comprises at least one metal via stack, the at least one metal via stack extending from a lower metal layer in the IC chip to an upper metal layer in the IC chip, such that each of the plurality of monitor chains forms a continuous circuit, and where the at least one metal via stack of each of the plurality of monitor chains is positioned substantially under the solder bump, wherein the lower metal layer of each of the plurality of monitor chains is of a different metal density;
    joining the IC chip to a semiconductor package;
    performing at least one stress test on the semiconductor package; and
    obtaining information related to the circuit.

2. The method of claim 1, wherein the stress test comprises at least one of the following: a thermocycle test, a hammer test, a drop test, a vibration test, or a thermal shock test.

3. The method of claim 1, wherein the method further comprises: comparing information related to each circuit.

4. The method of claim 1, wherein the information related to the circuit comprises one or more of the following: when the continuous circuit is broken, and when a change in resistance in the continuous circuit occurs.

5. The method of claim 1, wherein the at least one solder bump pad comprises an array of C4 solder bump pads.

6. The method of claim 5, wherein the array comprises a 9×9 array of solder bump pads.

7. The method of claim 1, wherein the IC chip includes an ultra low-K layer, and wherein the at least one metal via stack extends from a metal layer below the ultra low-K layer to a metal layer above the ultra low-K layer.

8. The method of claim 7, wherein the upper metal layer is a top layer of the IC chip.

9. The method of claim 1, wherein the at least one solder bump pad is proximate to a corner of the IC chip.

10. The method of claim 1, wherein the monitor chain is positioned at least partially around the at least one solder bump pad, and wherein the monitor chain forms the continuous circuit at least partially around the at least one solder bump pad.

11. The method of claim 1, wherein the monitor chain is positioned at least partially under the at least one solder bump pad, and wherein the monitor chain forms the continuous circuit at least partially under the at least one solder bump pad.

12. A method of testing an integrated circuit (IC) chip, the method comprising:
    providing an IC chip having a plurality of layers, at least two of the plurality of layers being metal layers, wherein the IC chip includes a test structure comprising:
        a plurality of solder bump pads on the IC chip;
        a plurality of solder bumps, each of the plurality of solder bumps being positioned on a corresponding one of the plurality of solder bump pads; and
        a plurality of monitor chains, each of the plurality of monitor chains being proximate to one of the plurality of solder bump pads, wherein each of the plurality of monitor chains comprises at least two metal via stacks extending from a lower metal layer in the IC chip to an upper metal layer in the IC chip electrically isolated from the corresponding one of the plurality of solder bump pads, the lower metal layer of each of the plurality of monitor chains being of a different metal density, such that each of the plurality of monitor chains forms a corresponding plurality of continuous circuits proximate to and electrically isolated from the corresponding one of the plurality of solder bump pads, and where the at least one metal via stack is positioned substantially underneath the corresponding one of the plurality of solder bumps;
    joining the IC chip to a semiconductor package;
    performing at least one stress test on the semiconductor package; and
    obtaining information related to the circuit.

13. The method of claim 12, wherein the information related to the circuit comprises one or more of the following: when one of the plurality of continuous circuits is broken, and when a change in resistance in one of the plurality of continuous circuits occurs.

14. The method of claim 12, wherein the at least one solder bump pad is proximate to a corner of the IC chip.

15. The method of claim 12, wherein one of the plurality of monitor chains is positioned at least partially around the at least one solder bump pad, and wherein the one of the plurality of monitor chains forms the continuous circuit at least partially around the at least one solder bump pad.

16. The method of claim 12, wherein the IC chip includes an ultra low-K layer, and wherein the at least two metal via stacks extend from a metal layer below the ultra low-K layer to a metal layer above the ultra low-K layer.

17. The method of claim 16, wherein the upper metal layer is a top layer of the IC chip.

18. A method of testing an integrated circuit (IC) chip, the method comprising:
    providing a plurality of IC chips each having a plurality of layers, at least two of the plurality of layers of each IC chip being metal layers, wherein each of the plurality of IC chips includes a test structure comprising:

at least one solder bump pad on the IC chip;

a solder bump positioned on the at least one solder bump pad; and a monitor chain proximate to the at least one solder bump pad, wherein the monitor chain comprises at least one metal via stack, the at least one metal via stack extending from a lower metal layer in the IC chip to an upper metal layer in the IC chip, such that the monitor chain forms a continuous circuit proximate to the at least one solder bump pad, and where the at least one metal via stack is positioned substantially under the solder bump;

joining each of the plurality of IC chips to one of a plurality of semiconductor packages;

performing at least one stress test on the plurality of semiconductor package; and obtaining information related to the circuit of each of the plurality of ICs;

wherein the lower metal layer of each of the plurality of IC chips is of a different metal density.

19. The method of claim 18, wherein the information related to the circuit comprises one or more of the following: when the continuous circuit is broken, and when a change in resistance in the continuous circuit occurs.

\* \* \* \* \*